(12) United States Patent
Akimoto

(10) Patent No.: US 11,189,761 B2
(45) Date of Patent: Nov. 30, 2021

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/726,935

(22) Filed: Dec. 26, 2019

(65) Prior Publication Data

US 2020/0212269 A1    Jul. 2, 2020

(30) Foreign Application Priority Data

Dec. 28, 2018 (JP) .............................. JP2018-247494

(51) Int. Cl.
| | | |
|---|---|---|
| *H01L 33/50* | (2010.01) | |
| *H01L 25/075* | (2006.01) | |
| *H01L 25/16* | (2006.01) | |
| *G09G 3/20* | (2006.01) | |
| *G09G 5/38* | (2006.01) | |
| *H01L 21/66* | (2006.01) | |

(52) U.S. Cl.
CPC ......... *H01L 33/505* (2013.01); *G09G 3/2003* (2013.01); *G09G 5/38* (2013.01); *H01L 22/20* (2013.01); *H01L 25/0753* (2013.01); *H01L 25/167* (2013.01); *G09G 2320/0233* (2013.01); *G09G 2330/10* (2013.01); *H01L 2933/0041* (2013.01)

(58) Field of Classification Search
CPC ... H01L 25/0753; H01L 33/504; H01L 33/32; H01L 33/50; H01L 33/502
USPC ................ 257/88, 89, 98, E31.001, E31.097
See application file for complete search history.

(56) References Cited

U.S. PATENT DOCUMENTS

| | | | | |
|---|---|---|---|---|
| 8,791,474 B1 * | 7/2014 | Bibi | ...................... | G09G 3/3208 257/89 |
| 10,446,719 B2 * | 10/2019 | Bower | ...................... | F21V 9/08 |
| 10,796,971 B2 * | 10/2020 | Cok | ...................... | H01L 33/387 |
| 10,902,770 B2 * | 1/2021 | Iguchi | ...................... | H01L 33/60 |
| 2014/0367633 A1 | 12/2014 | Bibl et al. | | |

FOREIGN PATENT DOCUMENTS

| | | |
|---|---|---|
| JP | 2016-523450 | 8/2016 |
| JP | 2017-54092 | 3/2017 |

* cited by examiner

*Primary Examiner* — Bo B Jang
(74) *Attorney, Agent, or Firm* — Mori & Ward, LLP

(57) ABSTRACT

An image display device includes a plurality of pixels each of which includes a plurality of first subpixels and a second subpixel. The plurality of first subpixels is configured to emit red light, green light, and blue light. The second subpixel is configured to emit blue light. The plurality of pixels includes at least one pixel in which the plurality of first subpixels includes a defective subpixel which is supposed to emit predetermined light with a predetermined color. The second subpixel includes a light-emitting element and a wavelength conversion layer provided over the light-emitting element to convert emission light emitted from the light-emitting element to converted light with the predetermined color if the predetermined color is red or green.

9 Claims, 15 Drawing Sheets

IMAGE DISPLAY DEVICE AND METHOD FOR MANUFACTURING IMAGE DISPLAY DEVICE

CROSS-REFERENCE TO RELATED APPLICATIONS

This application is based upon and claims priority to Japanese Patent Application No. 2018-247494, filed on Dec. 28, 2018; the entire contents of which are incorporated herein by reference.

FIELD

Embodiments described herein relate generally to an image device and a method for manufacturing the image display device.

BACKGROUND

It is desirable to realize an image display device that is thin and has high luminance, a wide viewing angle, high contrast, and low power consumption. To satisfy such market needs, a display device that utilizes a self-luminous element is being developed as shown in JP A 2016-523450.

There are expectations for the advent of a display device using a micro LED which is a fine light-emitting element as a self-luminous element. When micro LEDs are used in an image display device, the number of elements increases as the image quality increases as in full high definition, 4K, 8K, etc., which makes yield improvement problematic.

In a micro LED image display device, the micro LEDs that are determined to be good parts in an electrical inspection are mounted to a panel module. A quality determination is performed again in a display confirmation inspection or the like for the panel module to which the micro LEDs are mounted.

Thus, because inspections are performed multiple times, the overall yield of the image display device is the yield at the inspection of the individual micro LEDs multiplied by the yield when mounting and after mounting to the panel module. Therefore, because the number of the mounted elements increases as the image quality increases, it is difficult to sufficiently increase the overall yield; and it may be difficult to have cost competitiveness with image display devices of other techniques.

Accordingly, for an image display device that uses micro LEDs, it is necessary to suppress the yield decrease and reduce the manufacturing cost.

SUMMARY OF INVENTION

According to one aspect the of the present invention, an image display device includes a plurality of pixels each of which includes a plurality of first subpixels and a second subpixel. The plurality of first subpixels is configured to emit red light, green light, and blue light. The second subpixel is configured to emit blue light. The plurality of pixels includes at least one pixel in which the plurality of first subpixels includes a defective subpixel which is supposed to emit predetermined light with a predetermined color. The second subpixel includes a light-emitting element and a wavelength conversion layer provided over the light-emitting element to convert emission light emitted from the light-emitting element to converted light with the predetermined color if the predetermined color is red or green.

According to another aspect the of the present invention, a method for manufacturing an image display device includes providing a plurality of first subpixels and a second subpixel, a defective subpixel detection process, and a wavelength conversion layer formation process. The plurality of first subpixels has a plurality of first light-emitting elements and is configured to emit red, green, and blue light. The second subpixel has a second light-emitting element and is configured to emit blue light. The defective subpixel detection process includes turning on the plurality of first light-emitting elements; acquiring image data of the plurality of first light-emitting elements which has been turned on; acquiring data of positions and light emission colors of at least one defective subpixel and other subpixels among the plurality of first subpixels based on the image data; and storing the data of the positions and the light emission colors. The at least one defective subpixel is supposed to emit predetermined light with a predetermined color. The wavelength conversion layer formation process includes providing wavelength conversion layers respectively over the plurality of first light-emitting elements. Based on the data of the positions and the light emission colors, a wavelength conversion layer is provided over the second light-emitting element to convert emission light emitted from the second light-emitting element to converted light with the predetermined color if the predetermined color is red or green.

DETAILED DESCRIPTION

Figure 1:
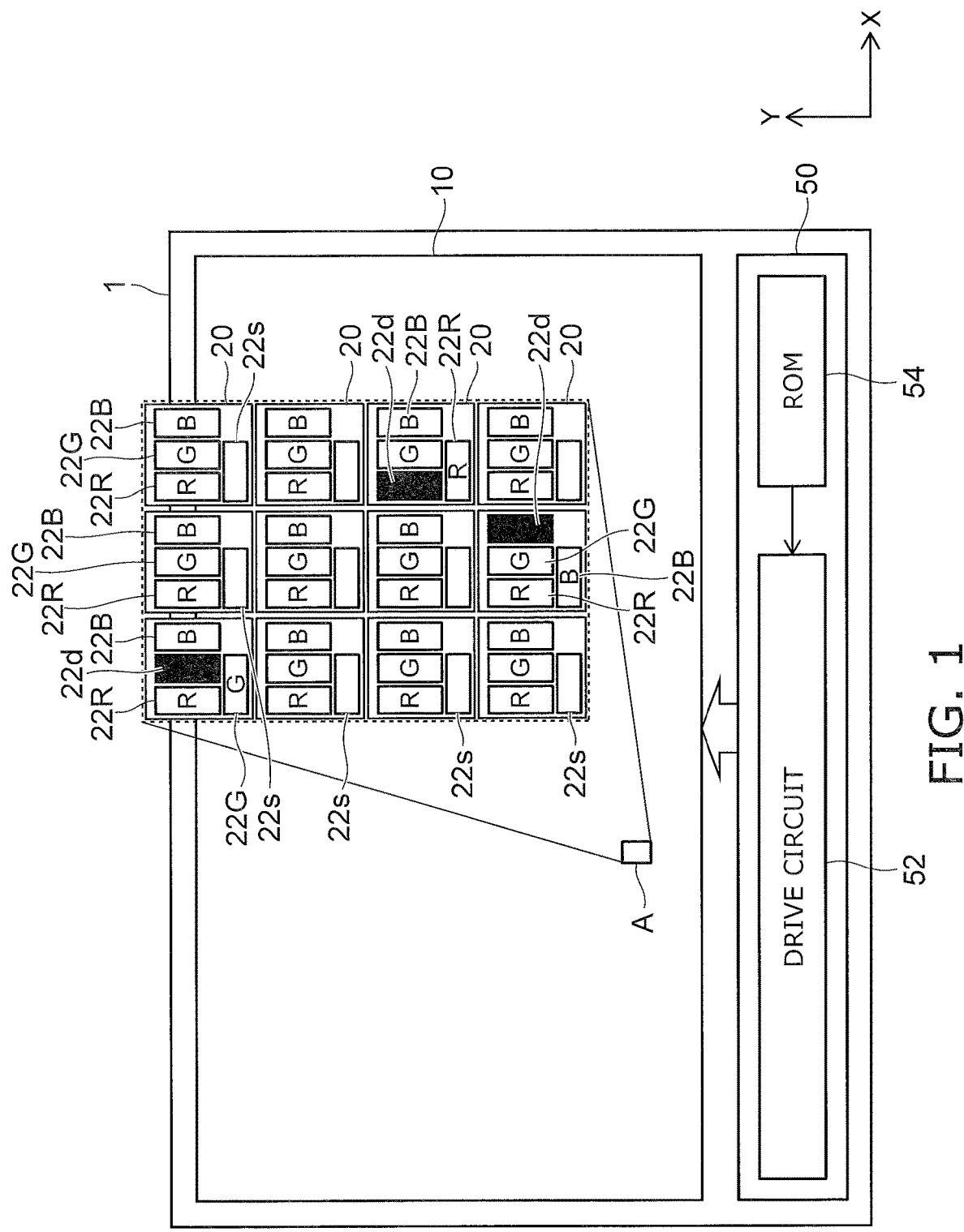
FIG. 1 is a schematic block diagram illustrating an image display device according to a first embodiment.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with the same reference numerals; and a detailed description is omitted as appropriate.

First Embodiment

FIG. 1 is a schematic block diagram illustrating an image display device according to an embodiment.

As shown in FIG. 1, the image display device 1 of the embodiment includes a display region 10 and a drive IC 50. The display region 10 and the drive IC 50 are provided on a not-illustrated substrate. In the substrate, an interconnect pattern is provided in one surface of an insulative base material and electrically connected to the light-emitting elements included in subpixels 22R, 22G, and 22B of each pixel 20.

As illustrated, the image display device 1 is substantially rectangular when viewed in plan; hereinbelow, the direction in which the long sides extend is taken as an X-axis; and the direction in which the short sides extend is taken as a Y-axis.

The display region 10 occupies almost the entire region of the image display device 1. The pixels 20 are formed in the display region 10. For example, the pixels 20 are arranged in a lattice configuration in the X-axis direction and the Y-axis direction. The number of the pixels 20 arranged in the X-axis direction and the Y-axis direction is the resolution of the image display device 1. For example, in an image display device having full high definition image quality, 1920×1080≈2 million pixels 20 are arranged in the display region 10. In an image display device having 4K image quality, 3840×2160≈8 million pixels 20 are arranged. In an image display device having 8K image quality, 7680×4320≈33 million pixels 20 are arranged.

The pixels 20 that are formed in the display region 10 each are driven by a drive circuit 52 of the drive IC 50. The drive circuit 52 drives each pixel based on not-illustrated external image data and display control data.

For example, as in the example, the drive IC 50 is provided along the lower side portion of the display region 10. The drive IC 50 is disposed at any appropriate position, is not limited to the lower side portion of the display region 10, and may be provided at the upper side portion or in a substrate other than the substrate where the display region 10 is formed. The drive IC 50 includes ROM 54. As elaborated below, the ROM 54 stores the positions of defective subpixels; and the drive circuit 52 determines the light emission colors of the normal subpixels and switches ON the normal subpixels based on the positions of the defective subpixels.

FIG. 1 shows an enlarged view of portion A which is a portion of the matrix of the pixels 20 arranged in the display region 10. 3×4 pixels 20 are shown in portion A.

The pixel 20 includes the three subpixels 22R, 22G, and 22B. The subpixel 22R emits light of a red light emission color. The subpixel 22G emits light of a green light emission color. The subpixel 22B emits light of a blue light emission color. The light emission color and the luminance of the pixel are determined by the drive circuit 52 adjusting the luminances of the subpixels 22R, 22G, and 22B.

In the case of the embodiment, an electrical inspection of the light-emitting elements included in the subpixels is not performed before forming the display region 10. Therefore, as shown in portion A, the display region 10 may include defective subpixels 22d. The defective subpixels 22d may be caused by defects of the light-emitting elements or discrepancies when mounting the light-emitting elements. As described below, the defective subpixels 22d may be a lighting failure in which the luminance is lower than a desired luminance, a case where the luminance is higher than a desired luminance, or a case of being in the lit state continuously regardless of the drive signal of the drive circuit 52.

Other than the three subpixels 22R, 22G, and 22B, the pixel 20 includes at least one redundant subpixel 22s. If one of the three subpixels 22R, 22G, and 22B is the defective subpixel 22d, the redundant subpixel 22s emits light of the original light emission color of the defective subpixel. The ROM 54 stores the positions of the defective subpixels 22d. In the pixels 20 including the defective subpixels 22d, the drive circuit drives the redundant subpixels 22s to have the light emission colors of the defective subpixels 22d based on the stored data of the ROM 54.

As described below in the description of FIG. 3A, FIG. 3B, and FIG. 3C, each normal subpixel includes a light-emitting element and a wavelength conversion layer of a fluorescer material or the like. In the defective subpixel 22d, a wavelength conversion layer of the fluorescer material or the like is not formed at the light-emitting element. Or, in the defective subpixel 22d, a wavelength conversion layer of an opaque material is formed at the light-emitting element.

If the defective subpixel 22d does not exist in the pixel 20, the redundant subpixel 22s is not driven by the drive circuit 52 and is unlit. Also, a wavelength conversion layer is not formed at the light-emitting element included in the redundant subpixel 22s.

In one pixel 20, for example, the three subpixels 22R, 22G, and 22B are arranged in this order toward the positive direction of the X-axis. The redundant subpixel 22s can be provided at any position inside the pixel 20. In the example, the redundant subpixel 22s is disposed adjacent to the arrangement of the three subpixels 22R, 22G, and 22B below the arrangement.

The redundant subpixel 22s is not limited to the case described above and is provided at any position.

Figure 2A:
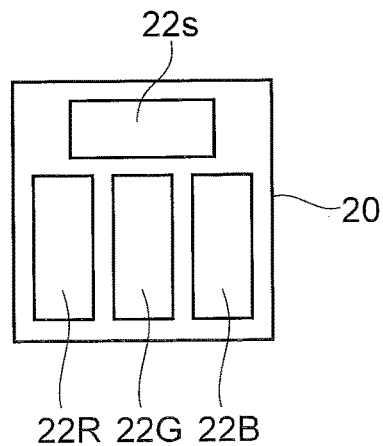
FIG. 2A to FIG. 2C are schematic plan views illustrating arrangements of the subpixels of the image display device of the first embodiment.
Figure 2B:
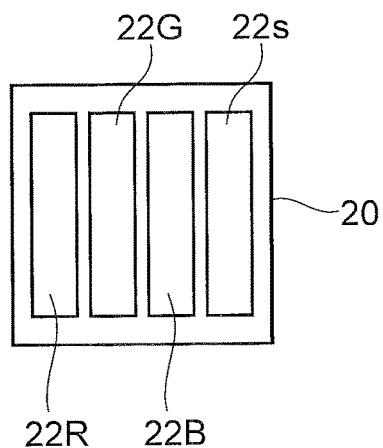
Figure 2C:
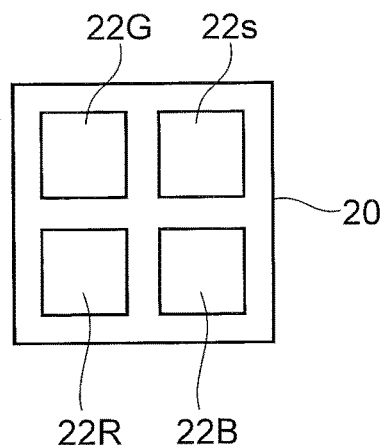

FIG. 2A to FIG. 2C are schematic plan views illustrating arrangements of the subpixels of the image display device of the embodiment.

As shown in FIG. 2A, the redundant subpixel 22s may be provided above the arrangement of the three subpixels 22R, 22G, and 22B.

As shown in FIG. 2B, the redundant subpixel 22s may be arranged beside the three subpixels 22R, 22G, and 22B.

As shown in FIG. 2C, the redundant subpixel 22s may be arranged in a 2×2 lattice configuration with the three subpixels 22R, 22G, and 22B.

Specifically, the relationship between the defective subpixel 22d and the redundant subpixel 22s is as follows. For example, in the pixel 20 of the uppermost row and the leftmost column in portion A, the subpixel of the central column is the defective subpixel 22d. Originally, the subpixel 22G that has the green light emission color would be disposed in the central column of the pixel 20. Because the subpixel of the central column is the defective subpixel 22d, the subpixel 22G that has the green light emission color is disposed at the position of the redundant subpixel 22s. That is, the redundant subpixel 22s emits light of the green light emission color instead of the subpixel of the central column.

In the pixel 20 of the rightmost column and the third row from the top in portion A, the subpixel in the left column is the defective subpixel 22d. Originally, the subpixel 22R that has the red light emission color would be disposed in the subpixel of the left column of the pixel 20. Because the subpixel of the left column is the defective subpixel 22d, the subpixel 22R that has the red light emission color is disposed at the position of the redundant subpixel 22s. That is, the redundant subpixel 22s emits light of the red light emission color instead of the subpixel of the left column.

In the pixel 20 of the lowermost row and the central column in portion A, the subpixel in the right column is the defective subpixel 22d. Originally, the subpixel 22B that has the blue light emission color would be disposed in the subpixel of the right column of the pixel 20. Because the subpixel of the right column is the defective subpixel 22d, the subpixel 22B that has the blue light emission color is disposed at the position of the redundant subpixel 22s. That is, the redundant subpixel 22s emits light of the blue light emission color instead of the subpixel of the right column.

In the pixel 20 in which the defective subpixel 22d does not exist, the redundant subpixel 22s is set to be unlit. For example, in the pixel 20 of the central column of the uppermost row in portion A, no fluorescer layer is formed at the redundant subpixel 22s; and the redundant subpixel 22s is not driven by the drive circuit 52 and remains as simply a redundant element.

The ROM 54 of the drive IC 50 stores the positions of the defective subpixels 22d and sets the drive circuit 52 to drive the normal subpixels using data of the light emission colors corresponding to the positions.

FIG. 3A to FIG. 3D are schematic cross-sectional views illustrating portions of the image display device of the embodiment.

Figure 3A:
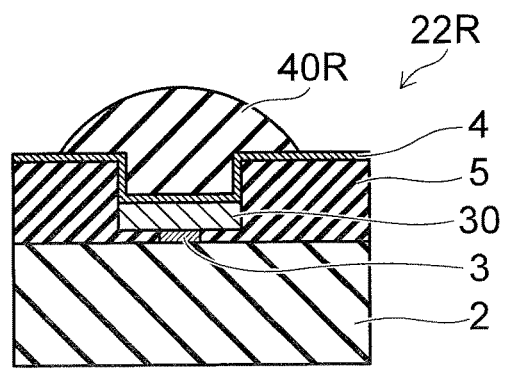
FIG. 3A to FIG. 3D are schematic cross-sectional views illustrating portions of the image display device of the first embodiment.

FIG. 3A is a cross-sectional view of the subpixel 22R having the red light emission color. A light-emitting element 30 is connected to a first interconnect 3 provided on one surface of an insulative substrate 2. The light-emitting element 30 is connected also to a second interconnect 4 provided on the upper surface of the light-emitting element 30. The light-emitting element 30 is connected to the drive circuit 52, etc., via the first interconnect 3 and the second interconnect 4. An insulating layer 5 is provided between the first interconnect 3 and the second interconnect 4 and electrically insulates between the first interconnect 3 and the second interconnect 4. A fluorescer layer 40R is provided on the upper surface of the light-emitting element 30.

The light-emitting element 30 is, for example, an element emitting blue light including GaN. The fluorescer layer 40R is a wavelength conversion layer of a wavelength conversion material that is excited by wavelengths of blue light and converts the wavelengths into a wavelength of red light.

Figure 3B:
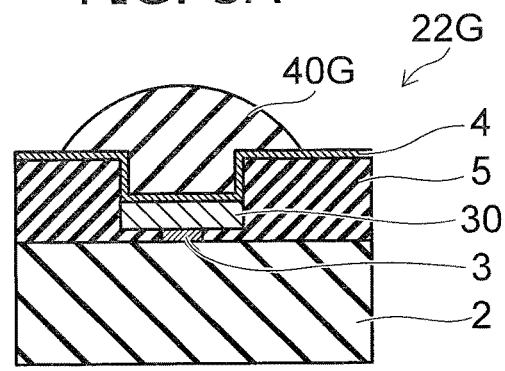

FIG. 3B is a cross-sectional view of the subpixel 22G having the green light emission color. Other than a fluorescer layer 40G, the configuration is similar to that of FIG. 3A. The fluorescer layer 40G is a wavelength conversion layer of a wavelength conversion material that is excited by wavelengths of blue light and converts the wavelengths into a wavelength of green light.

Figure 3C:
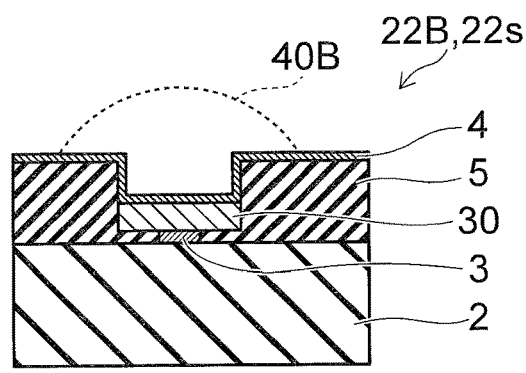

FIG. 3C is a cross-sectional view of the subpixel 22B having the blue light emission color. Because the light-emitting element 30 is a blue light-emitting element, a wavelength conversion layer may not be provided as in the example. To adjust the chromaticity of blue and to make the blue light emission color uniform inside the display region 10, a blue fluorescer layer 40B may be further provided as shown by the broken line. By providing the blue fluorescer layer 40B, the chromaticity change in oblique directions also can be suppressed.

The redundant subpixel 22s that is unlit has the same configuration as the blue subpixel 22B. A wavelength conversion layer is not provided at the redundant subpixel 22s because the redundant subpixel 22s is not driven by the drive circuit 52 and is unlit.

Figure 3D:
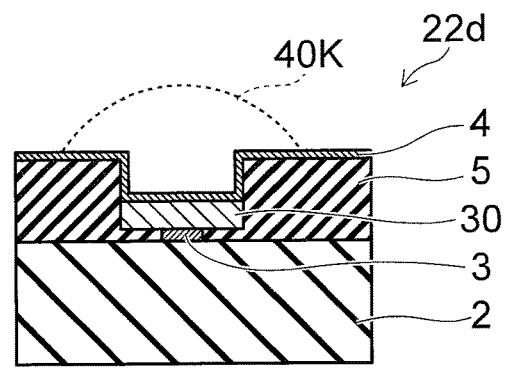

FIG. 3D is a cross-sectional view of the defective subpixel 22d. A fluorescer layer may not be provided in the defective subpixel 22d. In the defective subpixel 22d, there are cases where the light-emitting element 30 emits light of high luminance compared to the normal state or is continuously in the lit state; therefore, as illustrated by the broken line of the drawing, a wavelength conversion layer 40K that is opaque to the light emission of the light-emitting element 30 may be provided on the light-emitting element 30. The wavelength conversion layer 40K absorbs substantially all wavelengths of the light of the light-emitting element 30. The light emission color of the wavelength conversion layer 40K is substantially black.

Although the light-emitting elements 30 described above all are blue light-emitting elements, instead of a blue light-emitting element, a light-emitting element of bluish-violet light or ultraviolet light of about 405 nm which is advantageous for the luminous efficiency may be used. In the case where a light-emitting element of ultraviolet light is used, fluorescer layers that convert ultraviolet light into blue light are provided at the normal subpixels 22B. When a subpixel is the defective subpixel 22d, a wavelength conversion layer may not be provided; a blue fluorescer layer (wavelength conversion layer) may be provided; or an opaque wavelength conversion layer may be provided.

Other than general fluorescer materials, the wavelength conversion layers of the light emission colors may use quantum dot fluorescer materials. Quantum dot fluorescer materials are favorable because each light emission color can be realized; the monochromaticity can be high; and the color reproducibility can be high.

Operations of the image display device of the embodiment will now be described.

Figure 4:
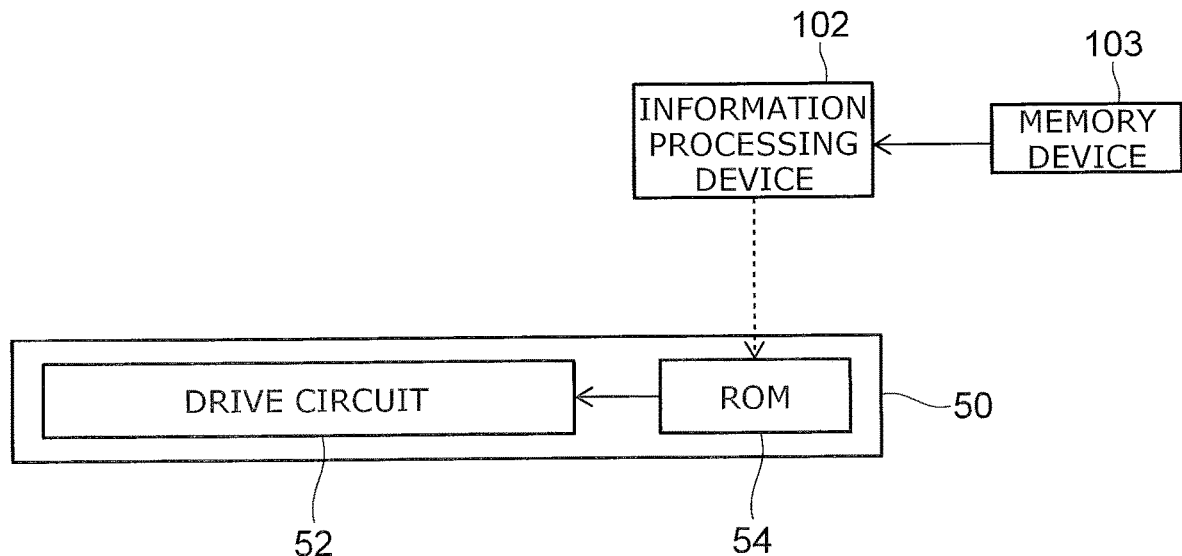
FIG. 4 is a block diagram illustrating a portion of the image display device of the first embodiment.

FIG. 4 is a block diagram illustrating a portion of the image display device of the embodiment.

As described above, the data of the positions of the defective subpixels 22d is stored in the ROM 54 of the drive IC 50. The data of the position of each subpixel 22R, 22G, and 22B of each pixel 20 is preset. For example, the position of each subpixel 22R, 22G, and 22B of each pixel 20 is identified according to XY coordinate data virtually provided inside the display region 10. The original light emission colors of the subpixels are pre-associated in the XY coordinate data.

As shown in FIG. 4, as elaborated below, the data that is stored in the ROM 54 is the data of the positions of the defective subpixels 22d that is acquired in one process of the method for manufacturing the image display device 1, stored in a memory device 103, transferred from the memory device 103 by an information processing device 102, and stored in the ROM 54.

The ROM 54 is read-only memory (ROM) that permits one or multiple data writes. This may be OTPROM (One Time Programmable ROM). The data is written every image display device 1 according to the occurrence state of the defective subpixels 22d of the image display device 1.

The drive circuit 52 operates based on image data and control data supplied from the outside. The drive circuit 52 refers to the data written to the ROM 54, converts the received image data into appropriate drive data, and drives the appropriate subpixels.

More specifically, when the drive circuit 52 drives using the data of the positions of the defective subpixels 22d written to the ROM 54, the drive circuit 52 drives the redundant subpixels 22s using the data of the original light emission colors of the defective subpixels 22d. In a pixel 20 in which the defective subpixel 22d does not exist, the drive circuit 52 drives the subpixels 22R, 22G, and 22B using the data of the original light emission colors. In such a case, the drive circuit 52 does not drive the redundant subpixel 22s.

A method for manufacturing the image display device 1 of the embodiment will now be described.

Figure 5:
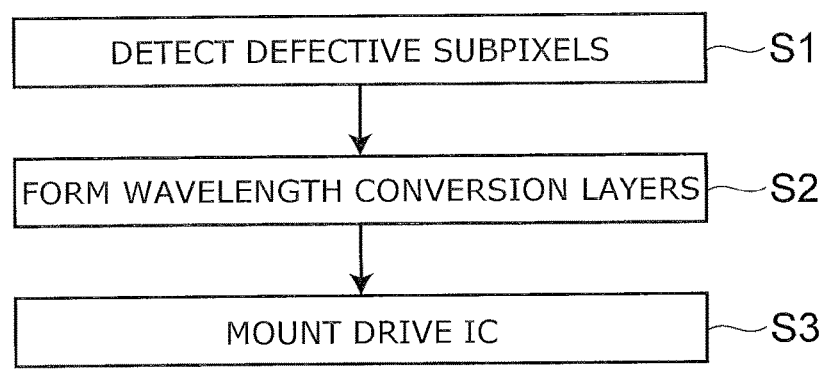
FIG. 5 is a flowchart illustrating the method for manufacturing the image display device according to the first embodiment.

FIG. 5 is a flowchart illustrating the method for manufacturing the image display device according to the embodiment.

In the method for manufacturing the image display device 1 as shown in FIG. 5, the defective subpixels 22d are detected in a defective subpixel detection process S1. As elaborated below, at this time, the light-emitting elements 30 are mounted to the display region 10; but fluorescer layers are not provided at any of the light-emitting elements 30. That is, all of the defective subpixels 22d are determined using the luminances of the light-emitting elements 30 emitting blue or ultraviolet light.

In a wavelength conversion layer formation process S2, the fluorescer layers 40R and 40G are formed respectively at the light-emitting elements 30 corresponding to the normal subpixels 22R and 22G. Blue fluorescer layers may be formed at the light-emitting elements 30 corresponding to the subpixels 22B. The wavelength conversion layer 40K which is a black, i.e., opaque, fluorescer layer may be provided at the light-emitting elements 30 corresponding to the defective subpixels 22d. As described below, an inkjet coating apparatus is used favorably to form the fluorescer layers. The fluorescer layers may be formed by adhering a fluorescer sheet.

In a drive IC mounting process S3, the data of the positions of the defective subpixels 22d stored in the memory device 103 is written to the ROM 54 of the drive IC 50 via the information processing device 102. The drive IC 50 that includes the ROM 54 to which the data is written is mounted to a prescribed position at the vicinity of the display region 10.

Data that includes a prescribed inspection display pattern, etc., is input to the image display device 1 to which the drive IC 50 is mounted; and the quality of the light emission of each pixel 20 is determined.

The details of each process will now be described.

Figure 6:
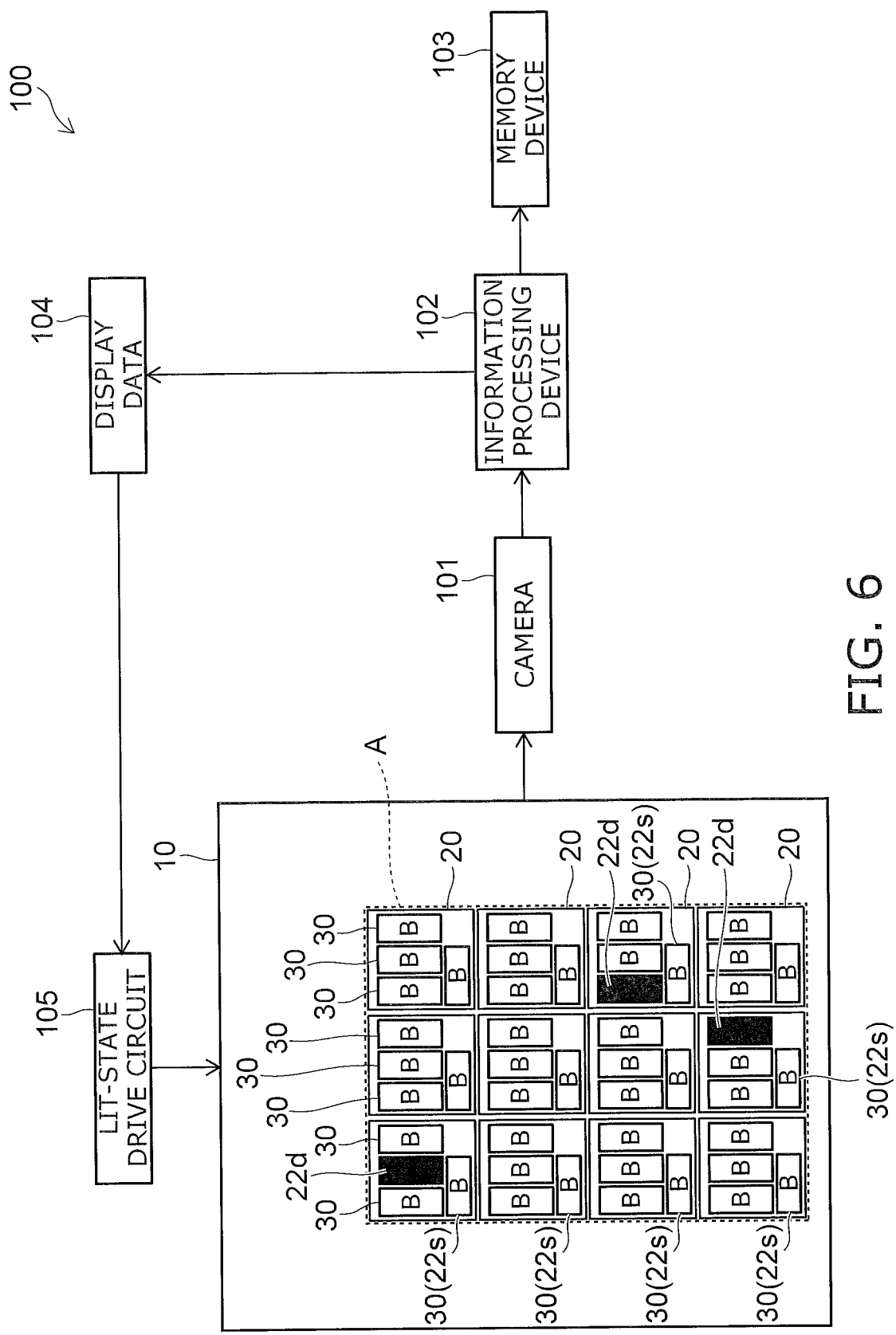
FIG. 6 is an example of a schematic block diagram for describing a portion of the method for manufacturing the image display device of the first embodiment.

FIG. 6 is an example of a schematic block diagram for describing a portion of the method for manufacturing the image display device of the embodiment.

FIG. 6 schematically shows the details of the configuration of a defective subpixel detection system 100 performing the defective subpixel detection process S1.

As shown in FIG. 6, the pixels 20 are arranged in a lattice configuration in the display region 10. Each pixel 20 includes four light-emitting elements 30 having blue light emission colors. Three of the four light-emitting elements 30 are arranged in one line; and the other one is disposed below the light-emitting elements 30 arranged in the one line. The light-emitting element 30 that is disposed below is the light-emitting element used as the redundant subpixel 22s. The drawing shows an enlarged view of portion A which is a portion of the display region 10. Similarly hereinafter, the details of the manufacturing processes are described using enlarged views of portion A of the display region 10.

The defective subpixel detection system 100 includes a camera 101, the information processing device 102, and the memory device 103. In the example, the camera 101 is connected to the information processing device 102. The information processing device 102 is connected to the memory device 103. The connections of the devices are not limited to those described above; and any appropriate connection configuration can be used. For example, the camera 101, the information processing device 102, and the memory device 103 may be connected on a common communication network and may be able to mutually transmit and receive data, etc.

Details of the defective subpixel detection process of the defective subpixel detection system 100 will now be described.

The information processing device 102 is, for example, a computer and operates according to a program. The information processing device 102 includes data of a preset imaging region. The data of the imaging region is, for example, the display region 10 split into four regions, etc. The imaging region is set based on the resolution of the camera 101. For example, the imaging region is set so that the resolution of the camera 101 is sufficient to perform the luminance determination when each light-emitting element 30 inside the imaging region is in the lit state.

Data such as the coordinates of the four split regions, etc., and the imaging sequence of the four split regions are set in the program of the information processing device 102. The information processing device 102 supplies, to a lit-state drive circuit 105, display data 104 of the imaging regions that will be imaged.

Based on the display data 104 that is set, the lit-state drive circuit 105 selects, drives, and causes the light-emitting elements 30 to emit light. The lit-state drive circuit 105 may use the drive circuit 52 of the drive IC 50; or a drive circuit different from that of the drive IC 50 may be prepared separately.

The camera 101 images a region including at least the imaging regions of the display region 10 set by the information processing device 102. In the case where the light-emitting element 30 emits ultraviolet light, the camera 101 includes imaging elements sensitive to ultraviolet light.

The information processing device 102 acquires the image data imaged by the camera 101. The information processing device 102 performs image processing of the image data acquired by the program and compares the light emission luminance of each light-emitting element 30 in the imaging regions to a prescribed value.

When the luminance of the light-emitting element is lower than a first prescribed value, the information processing device 102 determines that the light-emitting element 30 is the defective subpixel 22d. The information processing device 102 may use multiple prescribed values relating to the determination of the luminance. For example, a second prescribed value has a value greater than the first prescribed value. When the luminance of the light-emitting element 30 is higher than the second prescribed value, the light-emitting element 30 is determined to be the defective subpixel 22d.

Even if the luminance is within the range from the first prescribed value to the second prescribed value, the light-emitting element 30 is determined to be the defective subpixel 22d if the light-emitting element 30 is in the lit state even when all of the drive signals of the lit-state drive circuit 105 are OFF.

The information processing device 102 determines the positions of the detected defective subpixels 22d.

The information processing device 102 sets the data of the positions relating to all of the defective subpixels 22d inside the image data of the imaging region and transfers the data to the memory device 103.

The information processing device 102 sets the display data 104 of the next imaging region according to the program.

The information processing device 102 repeatedly performs the operations recited above for all of the imaging regions.

Details of the wavelength conversion layer formation process will now be described.

Figure 7:
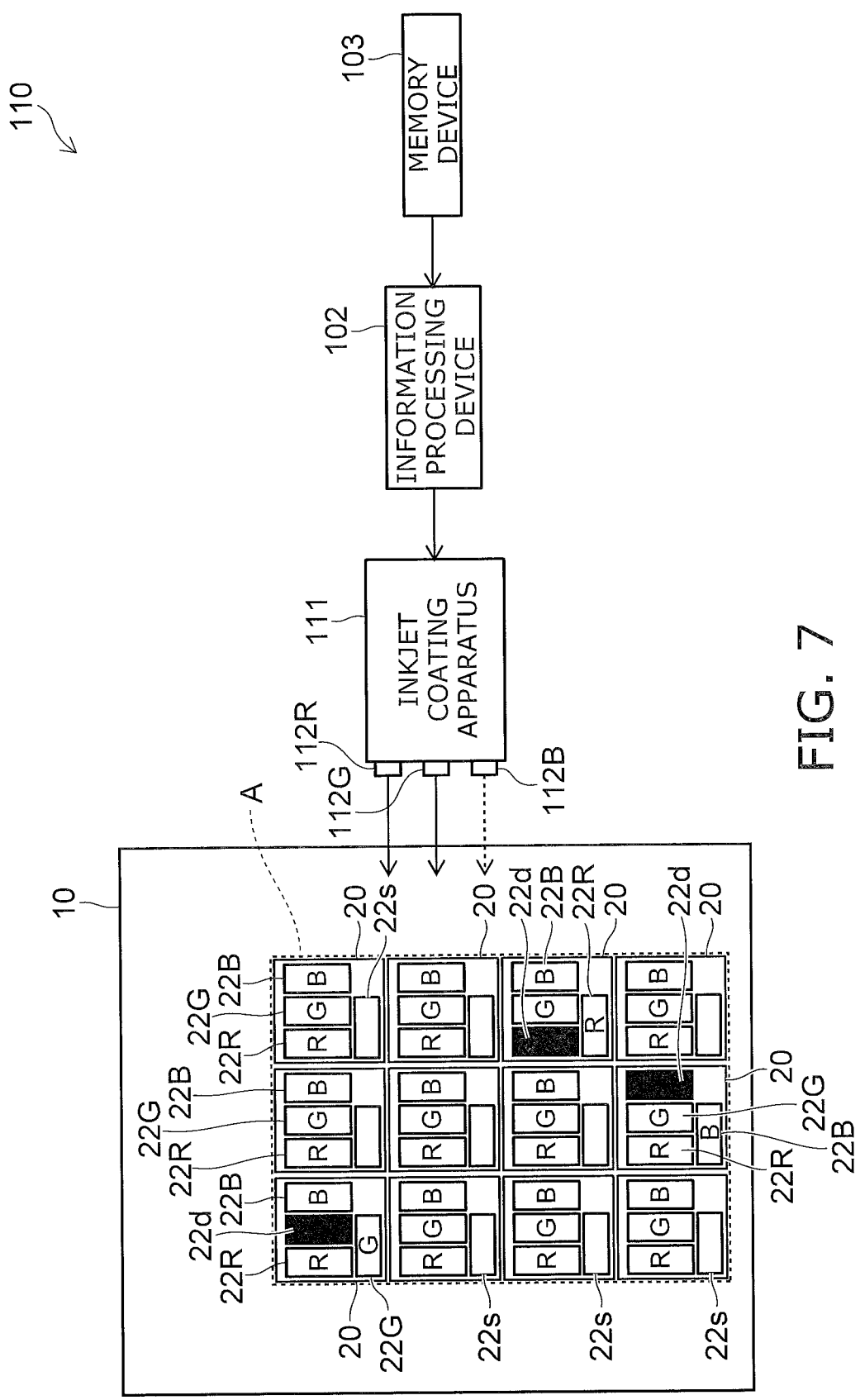
FIG. 7 is an example of a schematic block diagram for describing a portion of the method for manufacturing the image display device of the first embodiment.

FIG. 7 is an example of a schematic block diagram for describing a portion of the method for manufacturing the image display device of the embodiment.

FIG. 7 schematically shows the details of the configuration of a wavelength conversion layer formation system 110 performing the wavelength conversion layer formation process S2.

As shown in FIG. 7, the wavelength conversion layer formation system 110 includes an inkjet coating apparatus 111, the information processing device 102, and the memory device 103. The information processing device 102 and the memory device 103 can be the same as those used in the defective subpixel detection system 100 described above.

The inkjet coating apparatus 111 includes nozzles 112R and 112G. The nozzle 112R dispenses a fluorescent coating for forming a red fluorescer layer. The nozzle 112G dispenses a fluorescent coating for forming a green fluorescer layer. The color purity can be improved by mixing a red pigment or dye into the red fluorescent coating. The color purity can be improved by mixing a green pigment or dye into the green fluorescent coating. As shown by a broken line, the inkjet coating apparatus 111 may include a nozzle 112B dispensing a fluorescent coating for forming a blue fluorescer layer. A nozzle that dispenses an opaque coating having black coloring may be provided instead of the nozzle 112B or in addition to the nozzle 112B so that the coating is opaque to the light emission of the defective subpixel 22d.

The information processing device 102 accesses the memory device 103. The information processing device 102 acquires the data of the positions of the defective subpixels 22d stored by the defective subpixel detection system 100 and stored in the memory device 103.

The information processing device 102 transmits, to the inkjet coating apparatus 111, the data of the positions of the defective subpixels 22d acquired from the memory device 103.

The position data that corresponds to the light emission colors of the subpixels arranged in the display region 10 is provided beforehand to the inkjet coating apparatus 111. The inkjet coating apparatus 111 replaces the initial position data with the data relating to the defective subpixels 22d received from the information processing device 102.

For example, the data that is transmitted from the information processing device 102 shows that the center subpixel in the pixel 20 of the uppermost row and the leftmost column in portion A is the defective subpixel 22d. In the initial position data of the inkjet coating apparatus 111, the light emission color of the subpixel in the central column of the pixel 20 is set to green. The inkjet coating apparatus 111 does not dispense the green fluorescent coating at the position of the subpixel in the central column, and dispenses the green fluorescent coating at the position of the redundant subpixel 22s.

In the case of the pixel 20 of the rightmost column and the third row from the top in portion A, the data that is transmitted from the information processing device 102 shows that the subpixel in the left column is the defective subpixel 22d. In the initial position data of the inkjet coating apparatus 111, the light emission color of the subpixel in the left column is set to red. The inkjet coating apparatus 111 does not dispense the red fluorescent coating at the position of the subpixel in the left column, and dispenses the red fluorescent coating at the position of the redundant subpixel 22s.

In the case of the pixel 20 of the lowermost row and the central column in portion A, the data that is transmitted from the information processing device 102 shows that the subpixel in the right column is the defective subpixel 22d. In the initial position data of the inkjet coating apparatus 111, the light emission color of the subpixel in the right column is blue. In the case where the inkjet coating apparatus 111 forms a blue fluorescer layer, the inkjet coating apparatus 111 does not dispense a fluorescent coating at the position of the right column, and dispenses the blue fluorescent coating at the position of the redundant subpixel 22s. In the case where the blue fluorescer layer is not formed, a fluorescent coating is not dispensed at either the light-emitting element 30 of the right column or the redundant subpixel 22s.

When forming the fluorescer layers of the colors described above, the inkjet coating apparatus 111 may dispense opaque ink at the positions of the defective subpixels 22d.

Figure 8:
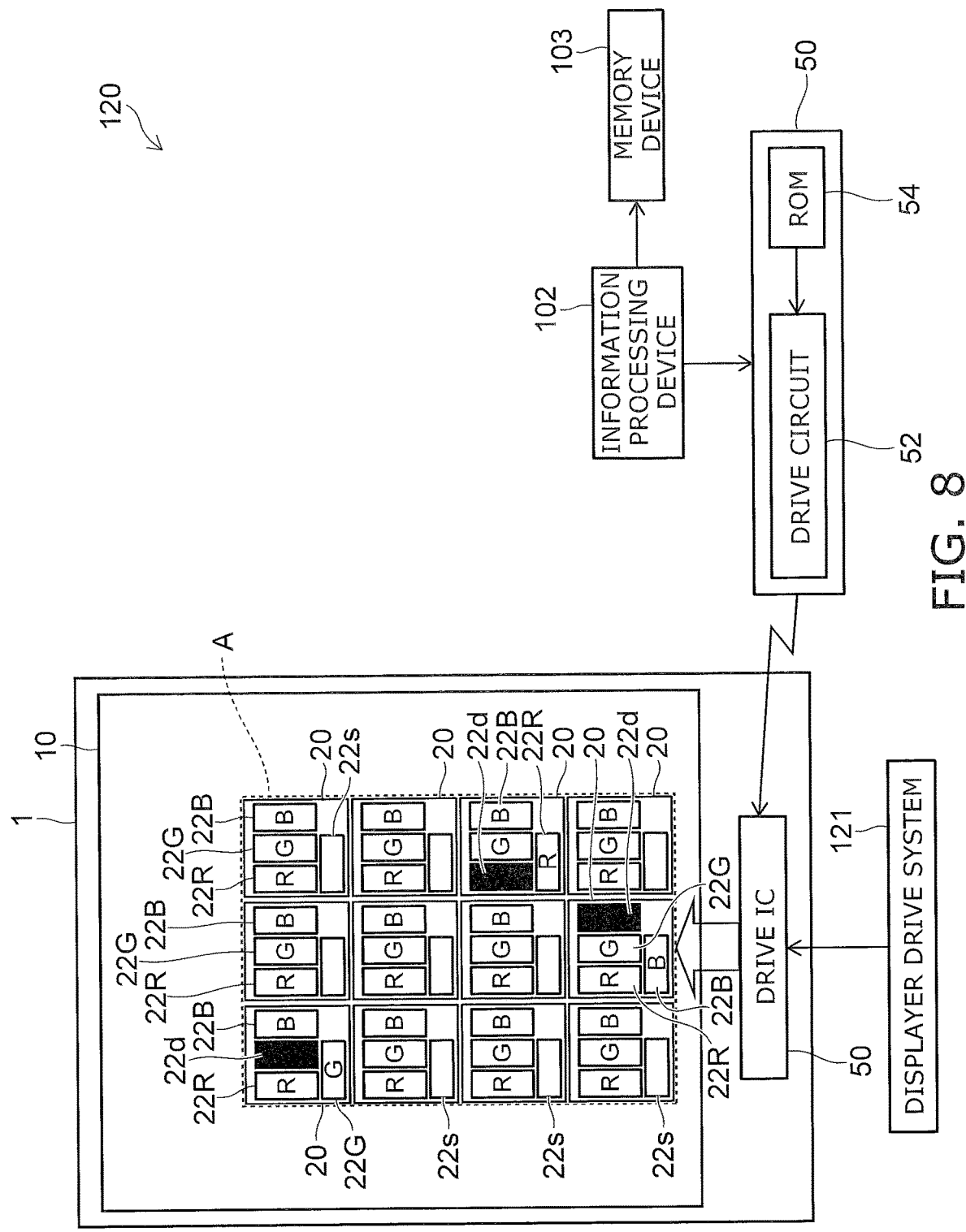
FIG. 8 is an example of a schematic block diagram for describing a portion of the method for manufacturing the image display device of the first embodiment.

FIG. 8 is an example of a schematic block diagram for describing a portion of the method for manufacturing the image display device of the embodiment.

FIG. 8 schematically shows the details of the configuration of a drive IC mounting system 120 performing the drive IC mounting process S3.

As shown in FIG. 8, the drive IC mounting system 120 includes the information processing device 102 and the memory device 103. The information processing device 102 and the memory device 103 can be the same as those used in the defective subpixel detection system 100 and the wavelength conversion layer formation system 110.

The information processing device 102 accesses the memory device 103 and acquires the data of the positions of the defective subpixels 22d.

The information processing device 102 writes, to the ROM 54, the acquired data of the positions of the defective subpixels 22d.

The drive IC 50 is mounted to a prescribed position of the image display device 1 by a not-illustrated electronic component mounting system. The writing of the data to the ROM 54 may be performed after mounting the drive IC 50.

The image display device 1 is connected to a displayer drive system 121. Data such as an inspection display pattern or the like is supplied from the displayer drive system 121 to the image display device 1; and the quality of each pixel 20 is determined.

Thus, the image display device 1 of the embodiment can be manufactured.

Effects of the image display device 1 of the embodiment will now be described.

The image display device 1 of the embodiment designates the positions of the defective subpixels 22d after mounting the light-emitting elements 30 to the display region 10 and switching ON the light-emitting elements 30. Therefore, an inspection process of the light-emitting elements 30 as single bodies before mounting is unnecessary. Accordingly, the overall manufacturing yield of the image display device 1 can be increased.

In the embodiment, each pixel 20 includes at least one redundant subpixel 22s. When the defective subpixel 22d exists inside the pixel 20, the light emission color of the redundant subpixel 22s is replaced with the original light emission color of the defective subpixel 22d. Accordingly, red, green, and blue can be included in substantially all of the pixels 20; therefore, an image display device that has good color reproducibility can be realized.

Instead of using a blue inorganic semiconductor light-emitting element, the light-emitting element 30 can be a light-emitting element emitting ultraviolet light by forming a fluorescer layer emitting blue light at the blue subpixels. By using a light-emitting element emitting ultraviolet light, the luminous efficiency of the fluorescer can be high, which contributes to a higher luminance of the image display device and lower power consumption.

Second Embodiment

In the embodiment described above, the subpixels are formed and the display regions are formed by forming fluorescer layers of the appropriate colors at light-emitting elements emitting blue or ultraviolet light. In the embodiment described below, effects similar to those of the other embodiment described above can be obtained by the light-emitting elements themselves being the red, the green, and the blue and by further providing the redundant subpixel at each pixel.

Figure 9:
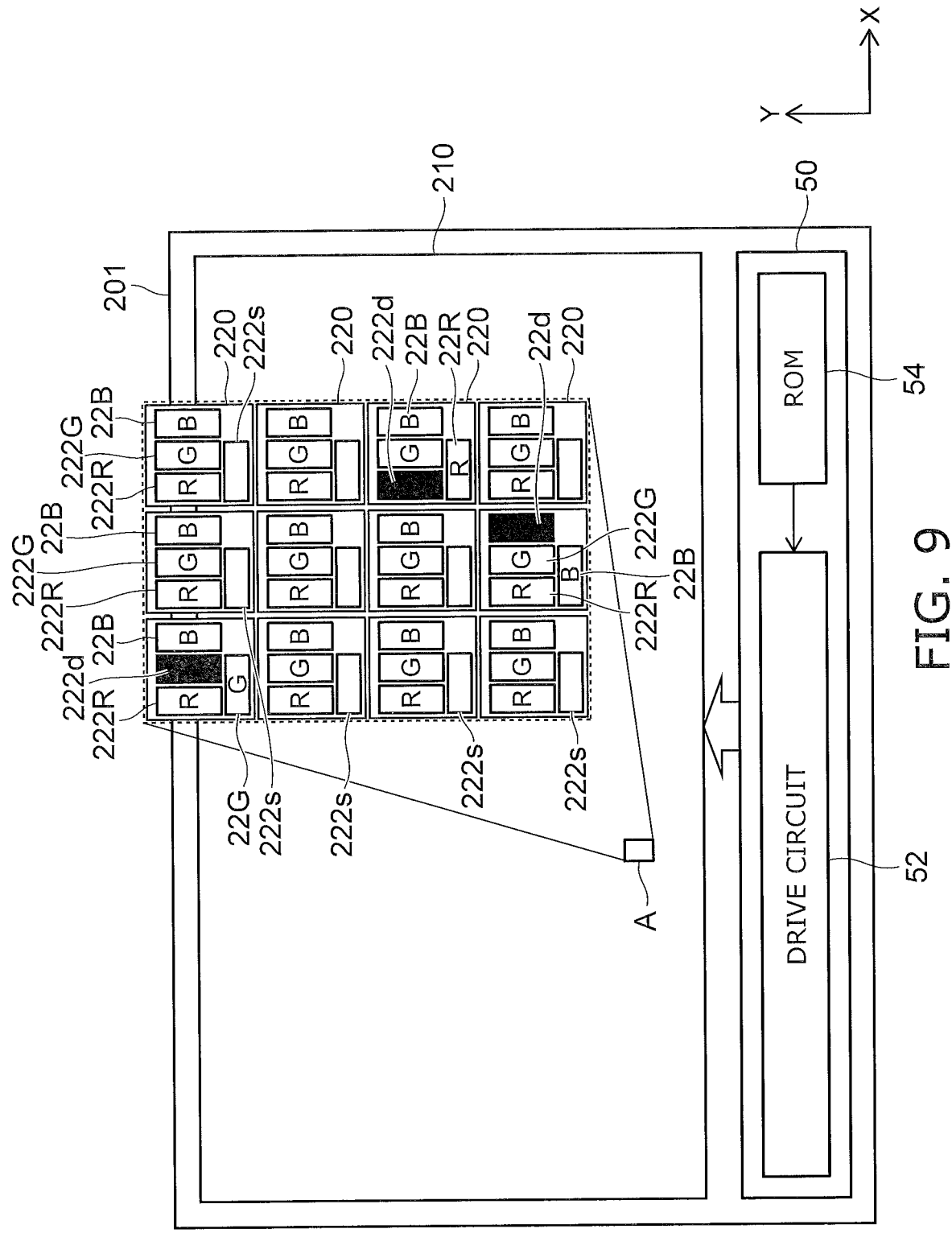
FIG. 9 is a schematic block diagram illustrating an image display device according to a second embodiment.

FIG. 9 is a schematic block diagram illustrating an image display device according to the embodiment.

As shown in FIG. 9, the image display device 201 of the embodiment includes a display region 210 and the drive IC 50. The drive IC 50 is similar to that of the other embodiment described above. For example, the display region 210 and the drive IC 50 are provided on a not-illustrated substrate.

Pixels 220 are arranged in a lattice configuration in the display region 210. Almost all of the pixels 220 each include subpixels 222R, 222G, and 22B and a redundant subpixel 222s. A portion of the remaining pixels 220 respectively includes a defective subpixel 222d, the subpixel 22B, and one of the subpixel 22R including the red fluorescer layer or the subpixel 22G including the green fluorescer layer. A portion of the remaining pixels 220 respectively includes the subpixels 222R, 222G, and 22B and the defective subpixel 22d. Here, the subpixel 22B is the subpixel described in reference to FIG. 3C of the other embodiment described above. The defective subpixel 22d is the defective subpixel described in reference to FIG. 3D.

Figure 10A:
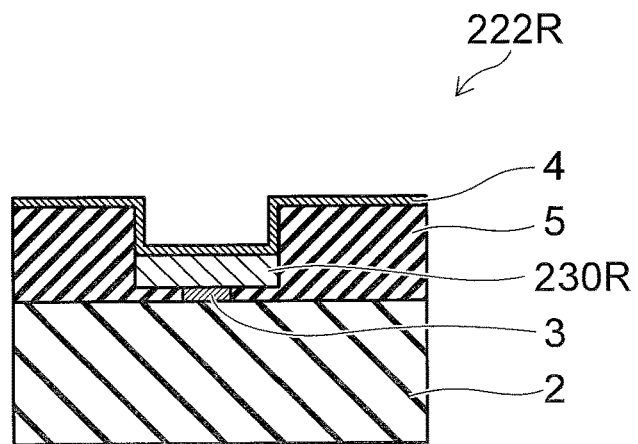
FIG. 10A to FIG. 10C are schematic cross-sectional views illustrating portions of the image display device of the second embodiment.
Figure 10B:
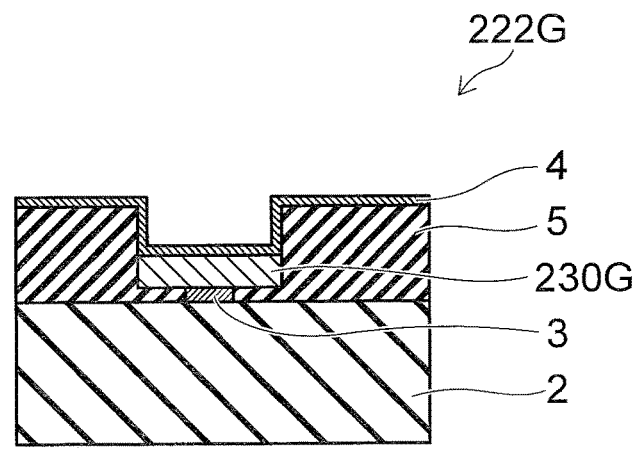
Figure 10C:
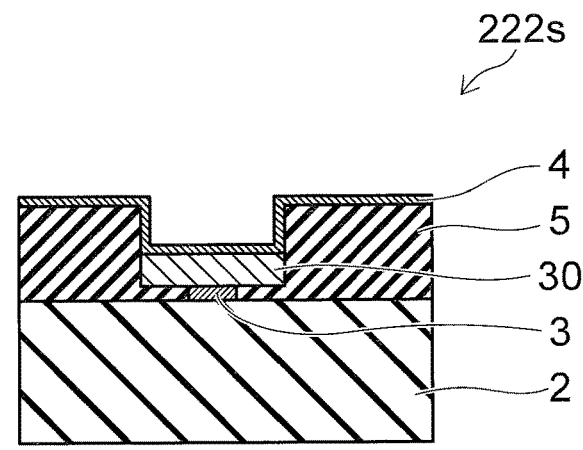

FIG. 10A to FIG. 10C are schematic cross-sectional views illustrating portions of the image display device of the embodiment.

FIG. 10A is a cross-sectional view of the subpixel 222R having the red light emission color. A light-emitting element 230R is a light-emitting element emitting red light. For example, the light-emitting element 230R is an inorganic semiconductor light-emitting element including AlGaAs, GaAsP, etc. The light-emitting element 230R is connected to the first interconnect 3 provided on one surface of the insulative substrate 2. The light-emitting element 230R is connected also to the second interconnect 4 provided on the upper surface of the light-emitting element 230R. The light-emitting element 230R is connected to the drive circuit 52, etc., via the first interconnect 3 and the second interconnect 4. The insulating layer 5 is provided between the first interconnect 3 and the second interconnect 4 and electrically insulates between the first interconnect 3 and the second interconnect 4.

FIG. 10B is a cross-sectional view of the subpixel 222G having the green light emission color. A light-emitting element 230G is a light-emitting element emitting green light. For example, the light-emitting element 230G is an inorganic semiconductor light-emitting element including InGaN, ZnSe, etc. Otherwise, the configuration is similar to that of FIG. 10A.

FIG. 10C is a cross-sectional view of the redundant subpixel 222s. The configuration of the redundant subpixel 222s is the same as the blue subpixel 22B described in reference to FIG. 3C of the other embodiment described above. In the embodiment, the subpixel 22B that has the blue light emission color is the same as that described in reference to FIG. 3C of the other embodiment described above.

Returning to FIG. 9, the configuration of each pixel 220 will now be described more specifically.

In the embodiment, the subpixel 222R that has the red light emission color or the subpixel 222G that has the green light emission color is called the defective subpixel 222d when defective; and the subpixel that has the blue light emission color is called the defective subpixel 22d when defective.

In the pixel 220 including the defective subpixel 222d, there are cases where a subpixel that originally has the red or green light emission color is defective as in the pixel 220 of the uppermost row and the leftmost column or the pixel 220 of the rightmost column and the third row from the top in portion A.

When the subpixel 222R having the red light emission color is defective, the subpixel 22R is formed by forming the red fluorescer layer 40R on the light-emitting element 30 of the redundant subpixel 222s to replace the original red subpixel 222R. Here, the subpixel 22R has the same configuration as the subpixel having the red light emission described in reference to FIG. 3A. In the drawing, the defective subpixel 222R having the red light emission is displayed as the defective subpixel 222d.

When the subpixel 222G having the green light emission color is defective, the subpixel 22G is formed by forming the green fluorescer layer 40G on the light-emitting element 30 of the redundant subpixel 222s; and the original green subpixel 222G is replaced. Here, the subpixel 22G has the same configuration as the subpixel having the green light emission described in reference to FIG. 3B. In the drawing, the defective subpixel 222G having the green light emission is displayed as the defective subpixel 222d.

Other than the description recited above, in the pixel 220 including the defective subpixel 222d, there are also cases where a subpixel that originally has the blue light emission color is defective as in the pixel 220 of the lowermost row and the central column in portion A. In such a case, the redundant subpixel 222s is used as-is as the subpixel 22B where the blue fluorescer layer is formed; and the original blue subpixel 22B is replaced. Here, the subpixel 22B has the same configuration as the subpixel having the blue light emission described in reference to FIG. 3C. In the drawing, the defective subpixel having the blue light emission is displayed as the defective subpixel 22d.

The method for manufacturing the image display device 201 of the embodiment will now be described.

Figure 11:
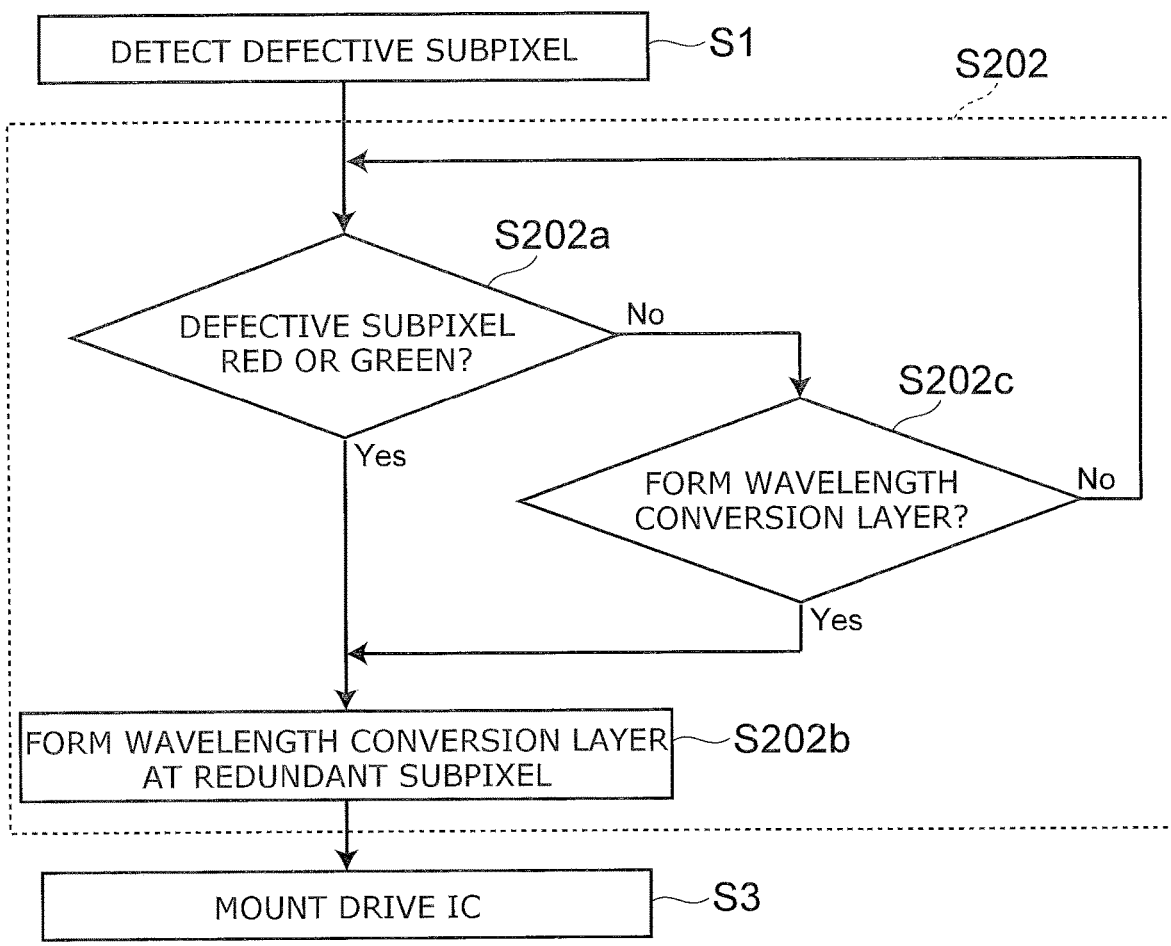
FIG. 11 is a flowchart illustrating the method for manufacturing the image display device according to the second embodiment.

FIG. 11 is a flowchart illustrating the method for manufacturing the image display device according to the embodiment.

As shown in FIG. 11, the drive IC mounting process S3 is similar to that of the other embodiment described above. A wavelength conversion layer formation process S202 is different from that of the other embodiment described above.

In the embodiment, the defective subpixels are detected in the defective subpixel detection process S1. Similarly to the other embodiment described above, in the defective subpixel detection process S1, all of the subpixels inside the imaging region are switched ON; and the positions of the defective subpixels are detected from the image data.

The light-emitting elements respectively emit red, green, and blue light. Therefore, if there is a risk of the determination of the defect positions being difficult due to color mixing, etc., when all of the subpixels are switched ON simultaneously, the defective subpixels may be detected for each light emission color by sequentially switching ON the light emission colors in the order of, for example, red, green, and blue.

In the wavelength conversion layer formation process S202, it is determined whether or not to form a wavelength conversion layer at the redundant subpixel 222s while determining the light emission colors of the defective subpixels 222d and 22d.

Specifically, in step S202a, the original light emission color of the defective subpixel 222d is determined. If the original light emission color is red or green, a fluorescer layer of the original light emission color of the defective subpixel 222d is formed in the redundant subpixel 222s in step S202b.

If the original light emission color of the defective subpixel 22d in step S202a is blue, it is determined whether or not to form a blue wavelength conversion layer in step S202c. In the case where the wavelength conversion layer is formed, a fluorescer layer of the blue light emission color is formed in the redundant subpixel 222s in step S202b. In the case where the wavelength conversion layer is not formed, step S202b is not performed; and the processing returns to step S202a.

There are many cases where it can be preset whether or not to form the blue fluorescer layer in the redundant subpixel 222s; therefore, the determination of step S202c may be fixed to one or the other beforehand.

The processing returns to step S202a and the steps described above are repeated until the fluorescer layers are formed for all of the redundant subpixels of the pixels 220 including the defective subpixels in step S202b.

Details of each process will now be described.

Figure 12:
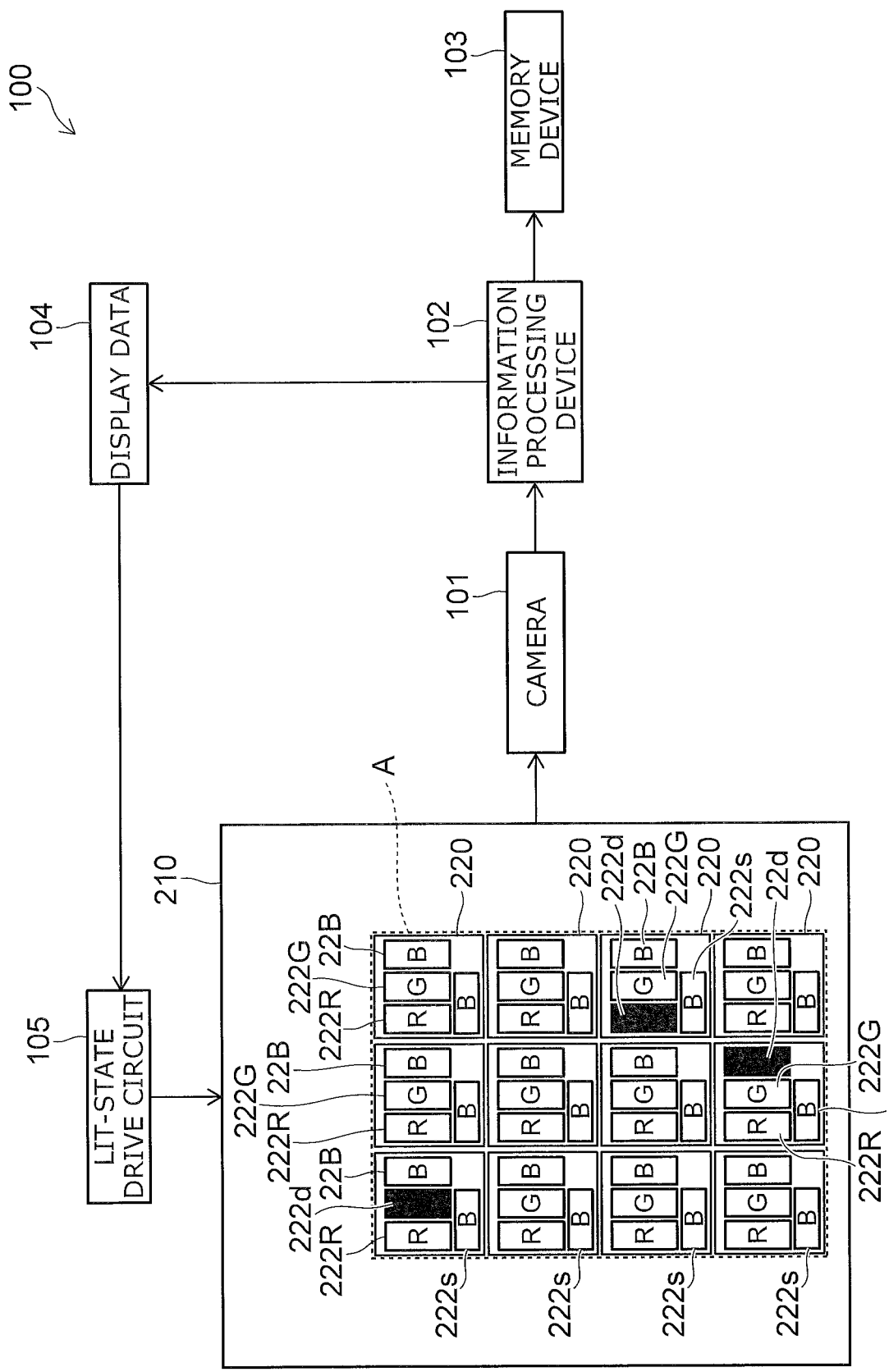
FIG. 12 is an example of a schematic block diagram for describing a portion of the method for manufacturing the image display device of the second embodiment.

FIG. 12 is an example of a schematic block diagram for describing a portion of the method for manufacturing the image display device of the embodiment.

FIG. 12 shows the configuration of the defective subpixel detection system 100 performing the defective subpixel detection process S1. The defective subpixel detection system 100 has the same configuration as that of the other embodiment described above. Accordingly, a detailed description of the defective subpixel detection system 100 is omitted as appropriate.

As shown in FIG. 12, the pixels 220 are arranged in a lattice configuration in the display region 210. Each pixel 220 includes the three subpixels 222R, 222G, and 22B and the redundant subpixel 222s. In the example, the subpixels 222R, 222G, and 22B are arranged in one line; and the redundant subpixel 222s is disposed below the subpixels 222R, 222G, and 22B arranged in the one line. The drawing shows an enlarged view of portion A which is a portion of the display region 210. Similarly hereinafter, the details of the manufacturing processes are described using enlarged views of portion A of the display region 210.

The details of the defective subpixel detection process of the defective subpixel detection system 100 will now be described for the differences from the other embodiment described above.

The information processing device 102 includes data of a preset imaging region; and the data of the imaging region is, for example, the display region 210 split into four regions, etc. The imaging region is set based on the resolution of the camera 101.

The information processing device 102 supplies, to the lit-state drive circuit 105, the display data 104 inside the set imaging region. At this time, the information processing device 102 may simultaneously switch ON all of the subpixels 222R, 222G, and 22B or may switch ON the light emission colors sequentially. When switching ON each light emission color, for example, the setting of the camera 101 may be such that the settings of exposure, white balance, etc., are set for each light emission color. The redundant subpixel 222s is the replacement subpixel when a defect exists inside the pixel 220. Therefore, data that switches ON the redundant subpixel 222s is not included in the display data 104 generated by the information processing device 102.

The lit-state drive circuit 105 selects, drives, and causes the subpixels 222R, 222G, and 22B to emit light based on the display data 104 that is set.

The camera 101 images at least a region of the display region 10 including the imaging region set by the information processing device 102.

The information processing device 102 acquires the image data imaged by the camera 101. The information processing device 102 performs image processing of the image data acquired by the program and compares the light emission luminances of the subpixels 222R, 222G, and 22B in the imaging region to a prescribed value.

When the luminances of the subpixels 222R, 222G, and 22B are lower than a first prescribed value, the information processing device 102 determines that the subpixels 222R, 222G, and 22B are the defective subpixels 222d. Similarly to the other embodiment described above, the information processing device 102 may use multiple prescribed values relating to the determination of the luminance. The second prescribed value has a value greater than the first prescribed value. When the luminances of the subpixels 222R, 222G, and 22B are higher than the second prescribed value, the subpixels are determined to be the defective subpixels 222d.

Even when the luminance is within the range of the first prescribed value to the second prescribed value, the subpixel is determined to be the defective subpixel 222d if the subpixel is in the lit state when all of the drive signals of the lit-state drive circuit 105 are OFF.

The first prescribed value and the second prescribed value may be set for each light emission color or may be set to the same values for all of the light emission colors.

The information processing device 102 determines the positions of the detected defective subpixels 222d. The information processing device 102 sets the data of the positions relating to all of the defective subpixels 222d inside the image data of the imaging region and transfers the data to the memory device 103. The information processing device 102 sets the display data 104 of the next imaging region according to the program. The information processing device 102 repeatedly performs the operations described above for all of the imaging regions.

Details of the wavelength conversion layer formation process will now be described.

Figure 13:
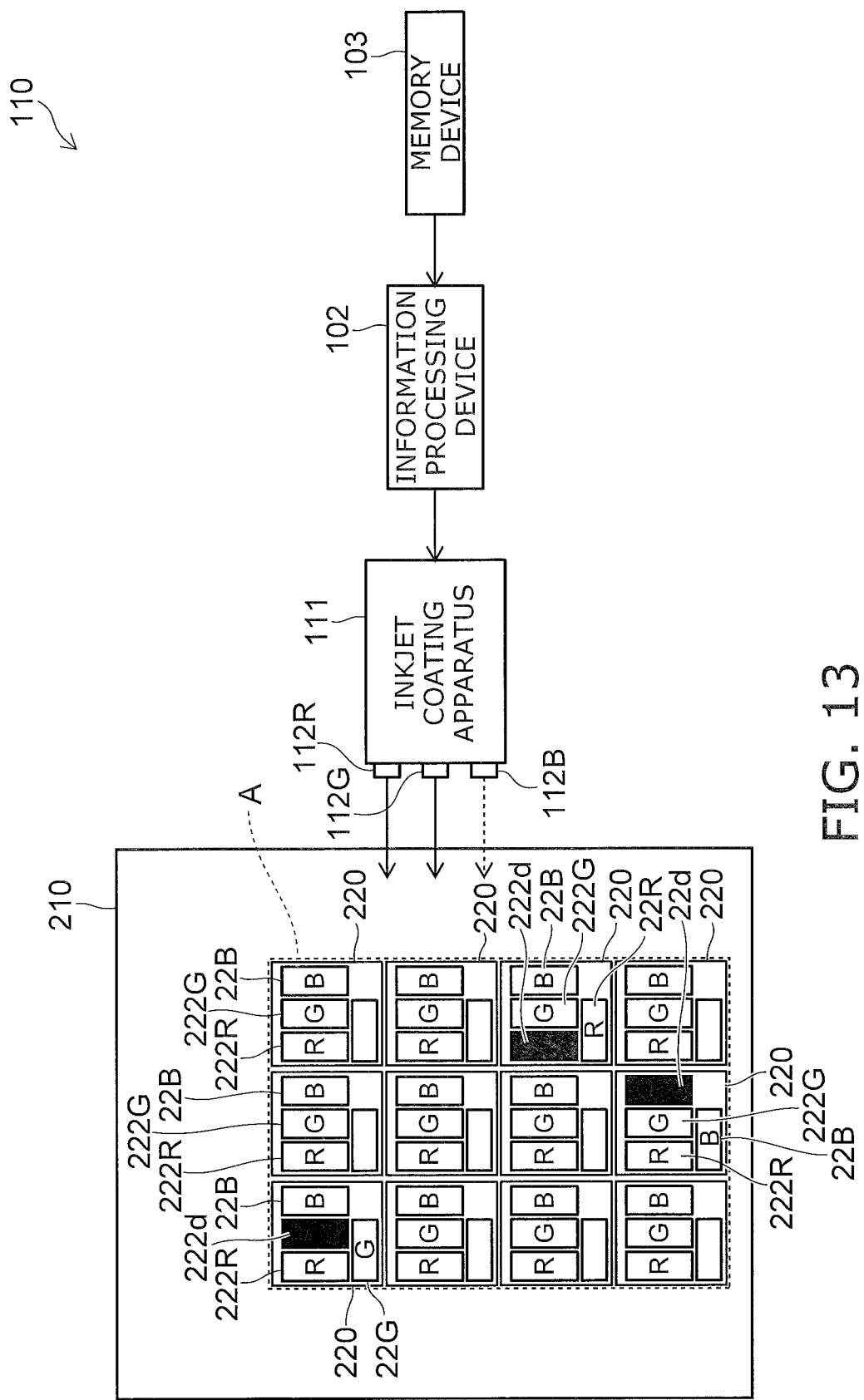
FIG. 13 is an example of a schematic block diagram for describing a portion of the method for manufacturing the image display device of the second embodiment.

FIG. 13 is an example of a schematic block diagram for describing a portion of the method for manufacturing the image display device of the embodiment.

FIG. 13 schematically shows the details of the configuration of the wavelength conversion layer formation system 110 performing the wavelength conversion layer formation process S202.

In the embodiment, the wavelength conversion layer formation system 110 that includes an inkjet coating apparatus 111 that is different from that of the other embodiment described above is used.

In the embodiment, the inkjet coating apparatus 111 includes the nozzle 112R dispensing the red fluorescent coating and the nozzle 112G dispensing the green fluorescent coating. When the defective subpixel 222d exists inside the pixel 220, the red fluorescer layer and the green fluorescer layer are used to form a fluorescer layer of the original light emission color of the defective subpixel 222d in the redundant subpixel 222s.

In the case where fluorescer layers are formed for each of the subpixels 222R, 222G, and 22B, the inkjet coating apparatus 111 further includes the nozzle 112B dispensing blue as shown by the broken line.

The inkjet coating apparatus 111 receives the data of the positions of the defective subpixels 222d from the information processing device 102. The inkjet coating apparatus 111 determines whether the original light emission color of each defective subpixel 222d is red or green.

When the original light emission color of the defective subpixel 222d is the red light emission color, the red fluorescent coating is dispensed in the redundant subpixel 222s of the pixel 220 in which the defective subpixel 222d exists. When the original light emission color of the defective subpixel 222d is the green light emission color, the green fluorescent coating is dispensed in the redundant subpixel 222s of the pixel 220 in which the defective subpixel 222d exists.

When the original light emission color of the defective subpixel 222d is the blue light emission color, nothing is done to the pixel 220 in which the defective subpixel 222d exists; and the light emission color of the next defective subpixel 222d is determined.

The inkjet coating apparatus 111 repeatedly performs the processing for all of the defective subpixels 222d as described above.

Figure 14:
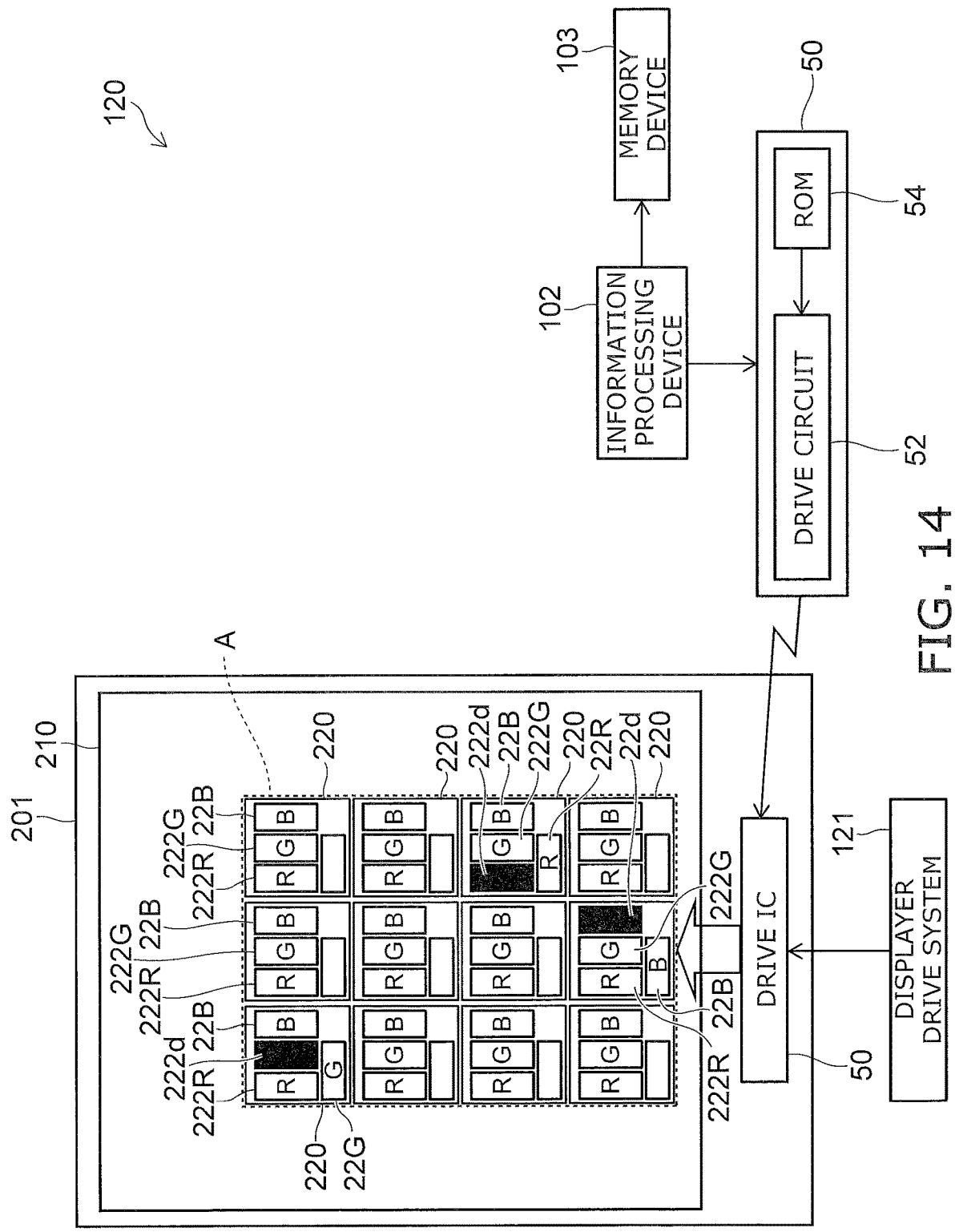
FIG. 14 is an example of a schematic block diagram for describing a portion of the method for manufacturing the image display device of the second embodiment.

FIG. 14 is an example of a schematic block diagram for describing a portion of the method for manufacturing the image display device of the embodiment.

FIG. 14 schematically shows the details of the configuration of the drive IC mounting system 120 performing the drive IC mounting process S3. The drive IC mounting system 120 can be the same as that of the other embodiment described above.

Effects of the image display device of the embodiment will now be described.

The image display device of the embodiment has the following effects in addition to the effects of the other embodiment described above.

Light-emitting elements that have red, green, and blue light emission colors are used as the subpixels; and a blue light-emitting element is used as the redundant subpixel 222s. Therefore, it is unnecessary to form a fluorescer layer for almost all of the pixels 220 in which the defective subpixel 222d does not exist; therefore, the period of the wavelength conversion layer formation process can be shortened; the period of all of the manufacturing processes can be shortened; thereby, the image display device can be manufactured inexpensively.

When fluorescer layers are formed in all of the subpixels 222R, 222G, and 22B, the chromaticity of each light emission color can be more stable; the chromaticity change in oblique directions can be suppressed; and a higher definition image display is possible.

Third Embodiment

The image display device described above can be used as an image display module having the appropriate number of pixels in, for example, a computer display, a television, a portable terminal such as a smartphone, car navigation, etc.

Figure 15:
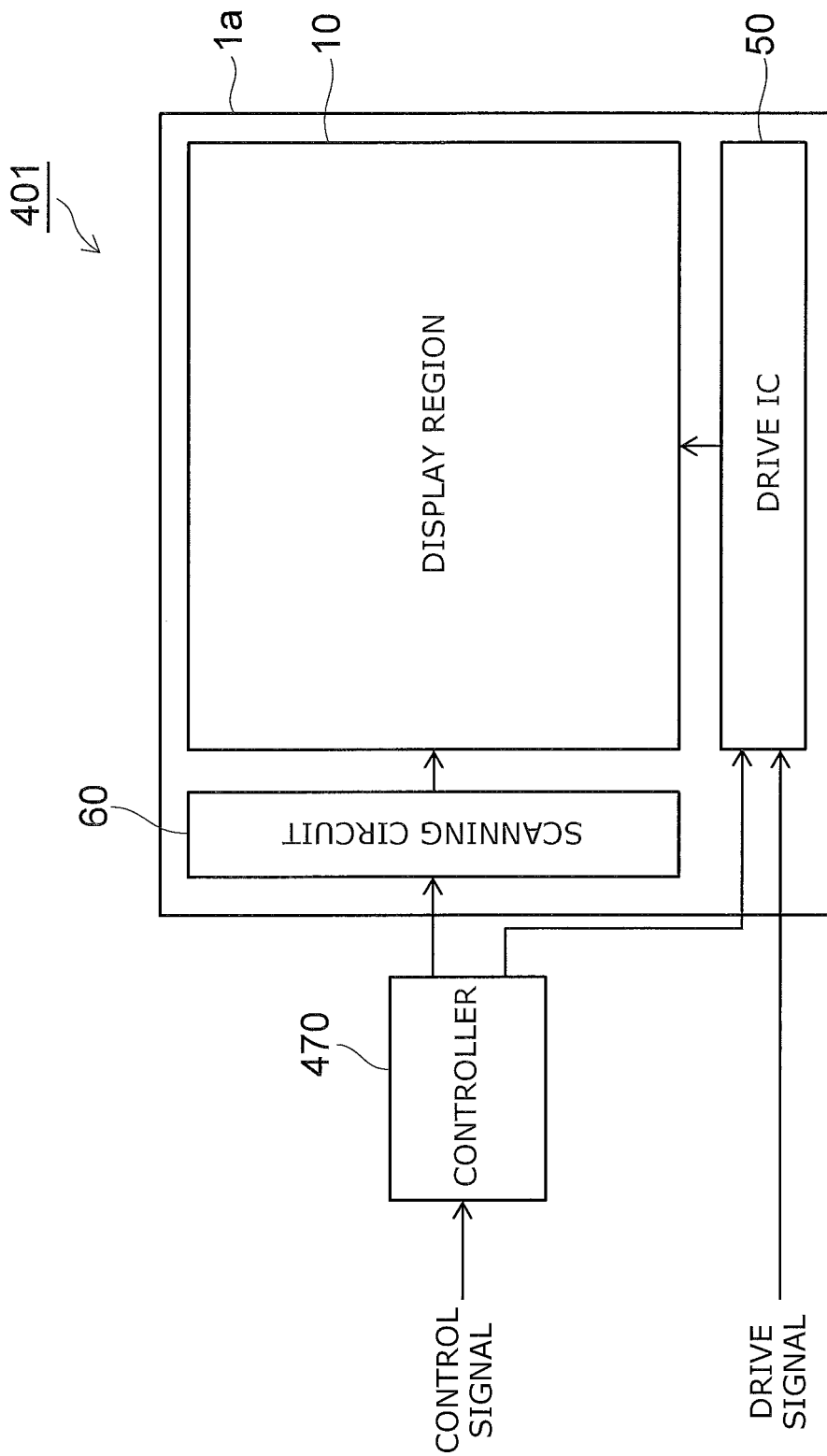
FIG. 15 is a block diagram illustrating the image display device according to the third embodiment.

FIG. 15 is a block diagram illustrating the image display device according to the embodiment.

FIG. 15 shows the major portions of the configuration of a computer display.

As shown in FIG. 15, the image display device 401 includes an image display module 1a. The image display module 1a includes the display region 10 and the drive IC 50 similar to those of the other embodiments described above. The image display module 1a further includes a scanning circuit 60. The scanning circuit 60 and the drive IC 50 set the drive sequence of the subpixels.

The image display device 401 further includes a controller 470. A control signal that is generated by separating by using not-illustrated interface circuitry is input to the controller 470; and the controller 470 controls the driving and the drive sequence of the subpixels in the drive IC 50 and the scanning circuit.

Modification

Figure 16:
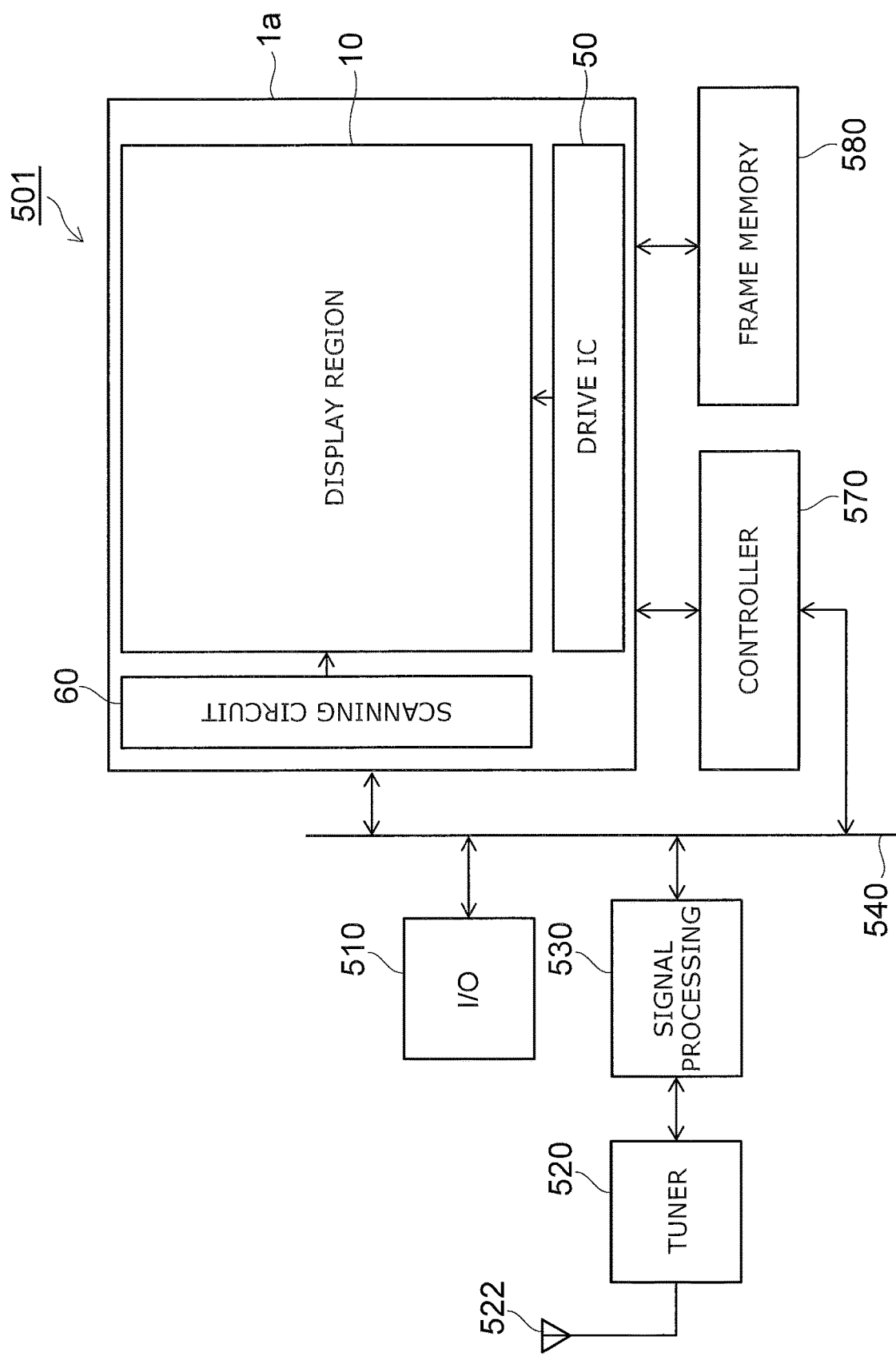
FIG. 16 is a block diagram illustrating an image display device of a modification of the third embodiment.

FIG. 16 is a block diagram illustrating an image display device of a modification.

FIG. 16 shows the configuration of a high-definition thin television.

As shown in FIG. 16, the image display device 501 includes the image display module 1a. The image display device 501 includes a controller 570 and frame memory 580. Based on a control signal supplied by a bus 540, the controller 570 controls the drive sequence of the subpixels of the display region 10. The frame memory 580 stores one frame of display data and is used for smooth processing such as video image reproduction, etc.

The image display device 501 includes an I/O circuit 510. The I/O circuit 510 provides interface circuitry and the like for connecting to external terminals, devices, etc. The I/O circuit 510 includes, for example, an audio interface, a USB interface connecting to an external hard disk device, etc.

The image display device 501 includes a tuner 520 and a signal processing circuit 530. An antenna 522 is connected to the tuner 520; and the necessary signal is generated by separating from the radio wave received by the antenna 522. The signal processing circuit 530 includes a DSP (Digital Signal Processor), a CPU (Central Processing Unit), etc.; and the signal that is generated by separating by the tuner 520 is generated by separating into image data, audio data, etc., by the signal processing circuit 530.

Other image display devices can be made by using the tuner 520 and the signal processing circuit 530 as a high frequency communication module for the transmission and reception of a mobile telephone, WiFi, a GPS receiver, etc. For example, the image display device that includes an image display module having the appropriate screen size and resolution can be used as a personal digital assistant such as a smartphone, a car navigation system, etc.

The image display module that is included in the image display device described above is not limited to that of the first embodiment described above and may be that of the second embodiment.

According to the embodiments described above, an image display device and a method for manufacturing the image display device can be realized in which the manufacturing yield is increased by remedying a portion of the pixels including a defective light-emitting element and by omitting an inspection process for the light-emitting elements as single bodies.

What is claimed is:

1. A method for manufacturing an image display device, the method comprising:
   providing a plurality of first subpixels and a second subpixel, the plurality of first subpixels having a plurality of first light-emitting elements and being configured to emit red, green, and blue light, the second subpixel having a second light-emitting element and being configured to emit blue light;
   a defective subpixel detection process comprising:
      turning on the plurality of first light-emitting elements;
      acquiring image data of the plurality of first light-emitting elements which has been turned on;
      acquiring data of positions and light emission colors of at least one defective subpixel and other subpixels among the plurality of first subpixels based on the image data, the at least one defective subpixel being supposed to emit predetermined light with a predetermined color; and
   storing the data of the positions and the light emission colors;
   a wavelength conversion layer formation process of providing wavelength conversion layers respectively over the plurality of first light-emitting elements; and
   providing, based on the data of the positions and the light emission colors, a wavelength conversion layer over the second light-emitting element to convert emission light emitted from the second light-emitting element to the predetermined light with the predetermined color if the predetermined color is red or green.

2. The method according to claim 1, wherein the plurality of first subpixels comprises:
   a first wavelength conversion layer provided over one of the plurality of first light-emitting elements which is configured to emit blue light, the first wavelength conversion layer being configured to convert a light emitted from the one of the plurality of first light-emitting elements to red light;
   a second wavelength conversion layer provided over another one of the plurality of first light-emitting elements which is configured to emit blue light, the second wavelength conversion layer being configured to convert a light emitted from the another one of the plurality of light-emitting elements to green light; and
   still another one of the plurality of first light-emitting elements configured to emit blue light.

3. The method according to claim 1, wherein the plurality of first light-emitting elements includes light-emitting elements emitting red, green, and blue light.

4. The method according to claim 1, wherein the at least one defective subpixel has a luminance lower than a prescribed luminance.

5. The method according to claim 1, wherein the at least one defective subpixel has a luminance higher than a prescribed luminance.

6. The method according to claim 5, wherein the wavelength conversion layer formation process includes providing a layer in the at least one defective subpixel, the layer being opaque.

7. The method according to claim 1, further comprising:
   a drive circuit connection process of connecting a drive circuit to the plurality of first light-emitting elements and the second light-emitting element, the drive circuit driving each of the plurality of first light-emitting elements and the second light-emitting element based on data of an image signal,
   the drive circuit including the data of the positions and the light emission colors of the at least one defective subpixel and the other subpixels among the plurality of first subpixels, the drive circuit driving the second light-emitting element to have a luminance of the predetermined light with the predetermined color of the at least one defective subpixel.

8. The method according to claim 1, wherein the plurality of first light-emitting elements and the second light-emitting element are inorganic semiconductor light-emitting elements.

9. The method according to claim 1, wherein the wavelength conversion layer is provided over the second light-emitting element via inkjet printing.

* * * * *